(12) United States Patent
Villanueva

(10) Patent No.: US 7,140,900 B1
(45) Date of Patent: Nov. 28, 2006

(54) PCI-E RETENTION

(75) Inventor: George Villanueva, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 11/344,287

(22) Filed: Jan. 31, 2006

(51) Int. Cl.
*H01R 13/62* (2006.01)

(52) U.S. Cl. .................................... 439/327

(58) Field of Classification Search ............... 439/308, 439/325, 327, 328, 366, 371; 361/801, 802
See application file for complete search history.

(56) References Cited

U.S. PATENT DOCUMENTS

| | | | | |
|---|---|---|---|---|
| 4,198,024 A | * | 4/1980 | Cavanna | 248/544 |
| 4,462,499 A | * | 7/1984 | Calabro | 211/41.17 |
| 5,383,793 A | * | 1/1995 | Hsu et al. | 439/327 |
| 5,650,917 A | * | 7/1997 | Hsu | 361/759 |
| 5,943,218 A | * | 8/1999 | Liu | 361/801 |
| 6,183,284 B1 | | 2/2001 | Gill et al. | |
| 6,331,940 B1 | * | 12/2001 | Lin | 361/785 |
| 6,529,386 B1 | * | 3/2003 | Boe | 361/801 |
| 6,738,261 B1 | | 5/2004 | Vier et al. | |
| 6,769,927 B1 | | 8/2004 | Brewer | |

OTHER PUBLICATIONS

Jim Brewer and Joe Sekel, PCI Express Technology, Feb. 2004, 11 pages, Dell, Inc.

* cited by examiner

*Primary Examiner*—Tho D. Ta
(74) *Attorney, Agent, or Firm*—Haynes and Boone, LLP

(57) ABSTRACT

A retainer includes a base member operable to be snapped onto a connector and a retaining member positioned substantially perpendicular to the base member for securely retaining the card coupled to the connector. The base member has an inner open area with dimensions substantially matching corresponding outside dimensions of the connector for a snug fit. The retaining member has a proximal section slidably coupled to a distal section. The proximal section is fixedly coupled to the base member. A length of the distal section is extensible beyond the proximal section to securely retain the card coupled to the connector.

17 Claims, 5 Drawing Sheets

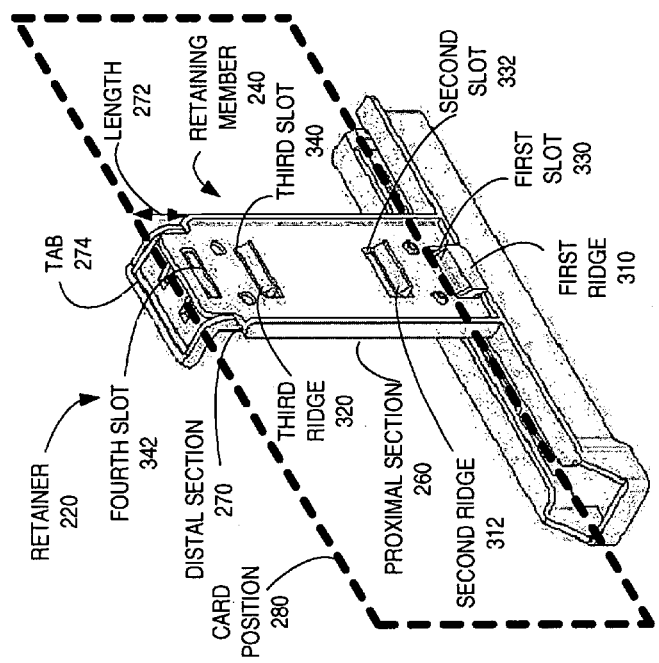
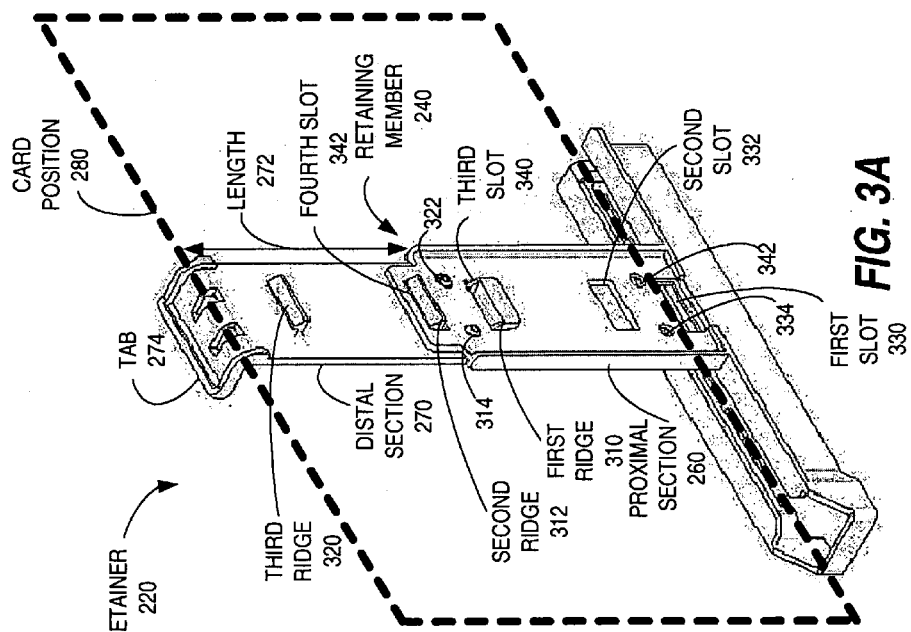

PCI-E RETENTION

BACKGROUND

The present disclosure relates to the field of electrical connections, and more particularly to methods and systems for improving integrity of electrical connections between various electronic components of an information handling system.

As the value and use of information continues to increase, individuals and businesses seek additional ways to acquire, process and store information. One option available to users is information handling systems. An information handling system ('IHS') generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, entertainment, and/or global communications. In addition, information handling systems may include a variety of hardware and software components that may be configured to process, store, and communicate information and may include one or more computer systems, data storage systems, and networking systems.

Printed circuit boards and/or electronic cards included in an IHS typically include an edge connector placed along a side of the card for insertion into a corresponding mating connector slot to establish electrical coupling. The card includes a plurality of electronic components including integrated circuit chips operable to perform at least one predefined function. When the card is properly inserted in the slot-type connector, electrical pads mounted on the edge connector of the card establish an electrical contact with receiving elements mounted within the connector slot. The frictional engagement between the edge connector and the receiving elements in the connector slot also holds the card in place. Maintaining a proper connection between the card and the connector is desirable for a proper operation of the IHS. In some cases, for added safety, the card and/or the connector may also include an additional mechanical arm or extension for card retention. In some cases, a separate card retention device may be provided to secure the card to the connector. The additional mechanical connection may be made with a screw or other fastening device, and is intended to assist in holding the card in a properly connected position in the respective connector slot.

Cards have been traditionally secured to the connectors by using screws, latches and/or clips. However, the use of fasteners such as screws for card retention generally creates additional component costs and also adds to the overall cost of manufacture and assembly of the IHS. Some clips used for card retention may require access to an underside surface of the connector for proper mounting. Recently, some cards such as graphics/video card have an increased component count for performing advanced graphics, thereby becoming heavier and larger. The graphics cards may be available in multiple form factors and often occupy two connector slots instead of one. Thus, traditional card retention techniques may be inadequate and/or may become costly to maintain security of the electrical coupling between the card and the connector included in an IHS, especially while the IHS is being physically moved.

Therefore, a need exists to develop tools and techniques for retaining cards, some of which may be heavier than a predefined weight and which may be coupled to more than one connector slot. Additionally, it would be desirable to have an improved card retainer that is screw less and is able to accommodate cards of various form factors. Accordingly, it would be desirable to provide a method and system for retaining cards included in an IHS, absent the disadvantages found in the prior methods discussed above.

SUMMARY

The foregoing need is addressed by the teachings of the present disclosure, which relates to improved card retention. According to one embodiment, a retainer includes a base member operable to be snapped onto a connector and a retaining member positioned substantially perpendicular to the base member for securely retaining the card coupled to the connector. The base member has an inner open area with dimensions substantially matching corresponding outside dimensions of the connector for a snug fit. The retaining member has a proximal section slidably coupled to a distal section. The proximal section is fixedly coupled to the base member. A length of the distal section is extensible beyond the proximal section to securely retain the card coupled to the connector.

Several advantages are achieved according to the illustrative embodiments presented herein. The embodiments advantageously provide an improved card retainer that is configured to snap on to a connector in a tool less manner, e.g., without using screws or similar fastening technique. A height of the card retainer is advantageously adjustable to match the height and form factor of the card. The card retainer is configured to accommodate a card which may weigh more than a predefined weight such as 400 grams and/or which may occupy two connector slots. Thus, the card retainer may be utilized to advantageously accommodate cards of various form factors and weights thereby increasing the flexibility and reducing costs for the assembly and manufacture of the information handling system having the connector and the card.

BRIEF DESCRIPTION OF THE DRAWINGS

FIGS. 3A and 3B each is a view in perspective illustrating additional features of a retaining member described with reference to FIG. 2A's and 2B, according to an embodiment.

DETAILED DESCRIPTION

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices, boards, cards, modules, blocks, and/or components described herein may be implemented as hardware (including discrete components, integrated circuits and systems-on-a-chip 'SOC'), firmware (including application specific integrated circuits and programmable chips) and/or software or a combination thereof, depending on the application requirements. Similarly, the functionality of various mechanical elements, members, and/or components for forming modules, sub-assemblies and assemblies assembled in accordance with a structure for an apparatus may be implemented using various materials and coupling techniques, depending on the application requirements.

For purposes of this disclosure, an IHS may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, the IHS may be a personal computer, including notebook computers, personal digital assistants, cellular phones, gaming consoles, a network storage device, or any other suitable device and may vary in size, shape, performance, functionality, and price. The information handling system may include random access memory (RAM), one or more processing resources such as central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to receive/transmit communications between the various hardware components.

Figure 1:
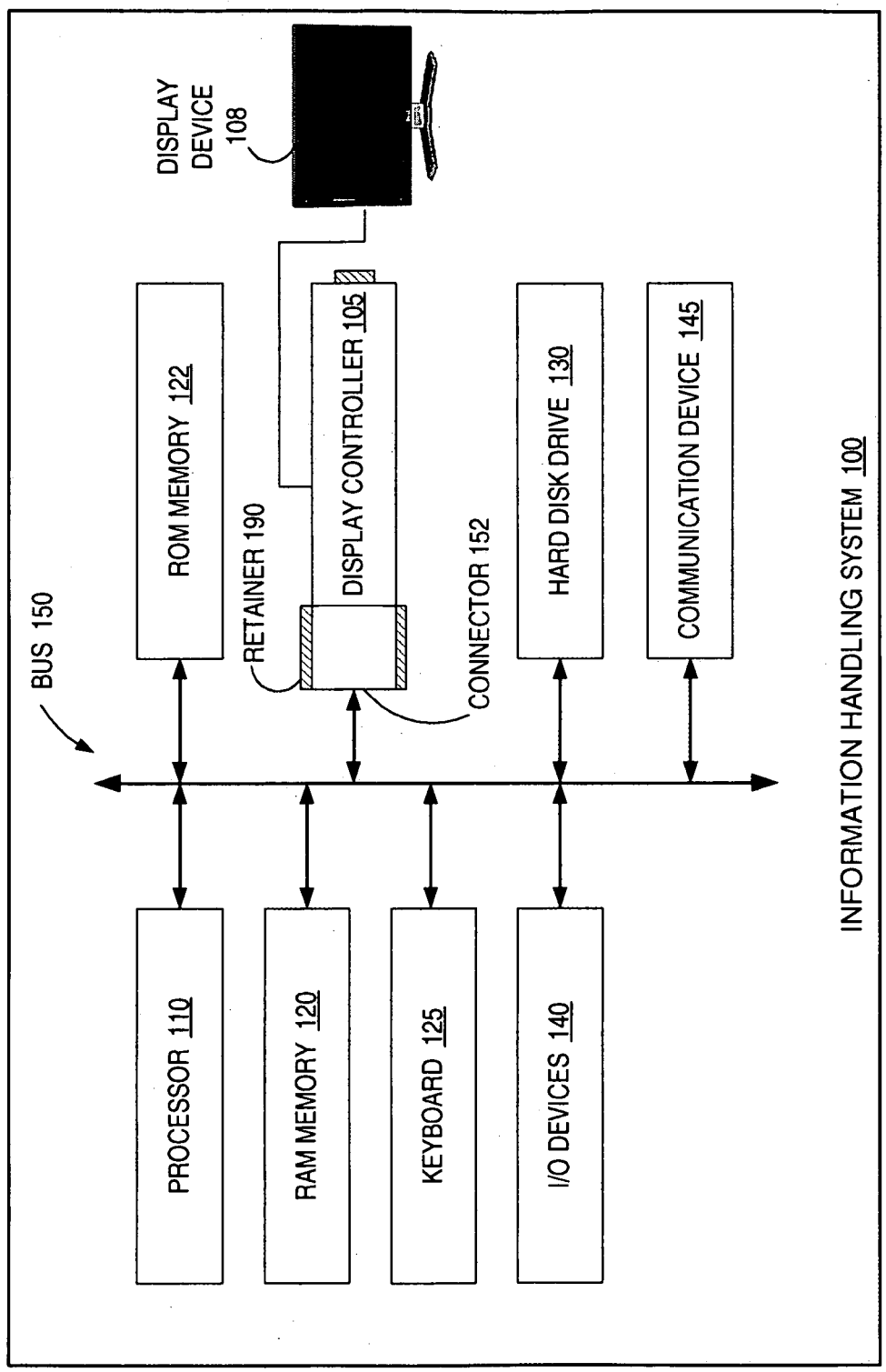
FIG. 1 illustrates a block diagram of an information handling system having an improved card retainer, according to an embodiment.

FIG. 1 illustrates a block diagram of an information handling system 100 having an improved card retainer, according to an embodiment. The information handling system 100 includes a processor 110, a system random access memory (RAM) 120 (also referred to as main memory), a non-volatile ROM 122 memory, a display controller 105 coupled to a display device 108, a keyboard 125 and an I/O controller 140 for controlling various other input/output devices. For example, the I/O controller 140 may include a keyboard controller, a cursor device controller and/or the serial I/O controller. It should be understood that the term "information handling system" is intended to encompass any device having a processor that executes instructions from a memory medium.

The IHS 100 is shown to include a hard disk drive 130 connected to the processor 110, although some embodiments may not include the hard disk drive 130. In a particular embodiment, the IHS 100 may include additional hard disks. The processor 110 communicates with the system components via a bus 150, which includes data, address and control lines. In one embodiment, the IHS 100 may include multiple instances of the bus 150. A communications device 145, such as a network interface card and/or a radio device, may be connected to the bus 150 to enable wired and/or wireless information exchange between the IHS 100 and other devices (not shown).

In a particular embodiment, the display controller 105 is coupled to the processor 110 via the bus 150 and a connector 152. A card retainer 190 (also referred to simply as a retainer) is snapped onto the connector 152 to retain the display controller 105. That is, the retainer 190 is intended to assist in holding the display controller 105 in a properly connected position in the slot of the connector 152. Additional detail of the retainer 190 is described with reference to FIG. 2.

The processor 110 is operable to execute the computing instructions and/or operations of the IHS 100. The memory medium, e.g., RAM 120, preferably stores instructions (also known as a "software program") for implementing various embodiments of a method in accordance with the present disclosure. An operating system (OS) of the IHS 100 is a type of software program that controls execution of other software programs, referred to as application software programs. In various embodiments the instructions and/or software programs may be implemented in various ways, including procedure-based techniques, component-based techniques, and/or object-oriented techniques, among others. Specific examples include assembler, C, XML, C++ objects, Java and Microsoft's .NET technology.

Figures 2A, 2B:
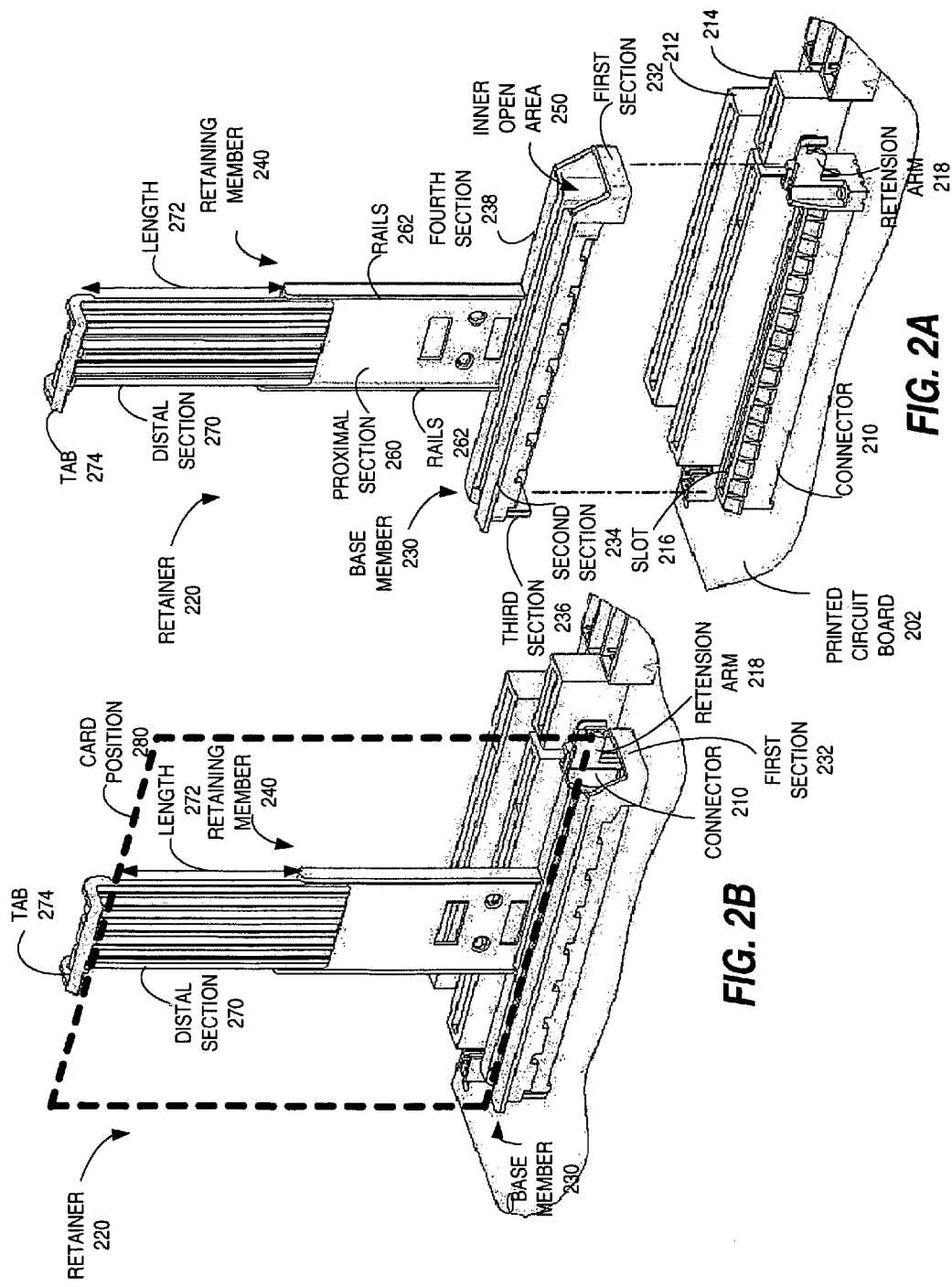
FIG. 2A illustrates a view in perspective of a retainer prior to being snapped onto a connector, according to an embodiment.
FIG. 2B illustrates a view in perspective of a retainer after being snapped onto a connector, according to an embodiment.

Referring to FIGS. 2A and 2B, FIG. 2A illustrates a view in perspective of a retainer prior to being snapped onto a connector, and FIG. 2B illustrates a view in perspective of a retainer after being snapped onto a connector, according to an embodiment. Referring back to FIG. 2A, a connector 210 is mounted on a printed circuit board (PCB) 202. In the depicted embodiment, unused connectors 212 and 214 may be mounted on the PCB 202. A retainer 220 is depicted to be properly positioned with respect to the connector 210 for being snapped onto the connector 210 in a tool less assembly. In a particular embodiment, the retainer 220 may be formed from a suitable plastic material such has nylon. In a particular embodiment, the retainer 220 is substantially the same as the retainer 190 described with reference to FIG. 1.

In the depicted embodiment, the size and shape of the connector 210 substantially resembles a rectangular prism having a slot 216 and a predefined form factor. The specific properties of the connector 210 such as number of connections (or pins) and dimensions may vary depending of the manufacturer and/or an industry standard. In a particular embodiment, the connector 210 is in accordance with a peripheral component interconnect express (PCIe) standard. The PCIe standard provides a variety of selectable form factors such as X1, X4, X8, X16, X32 and X64 to match desired performance and sizing features, although some of the link widths and/or form factors such as X32 and X64 remain unimplemented. In many video and graphics applications, the graphics cards may use the X16 form factor for the connector 210 supporting 164 pins/connections. It is contemplated that the connector 210 may be in accordance with other standards and form factors, including proprietary.

The connector 210 includes the slot 216 for removably (e.g., in a removable manner) receiving corresponding mating edge connectors (not shown) of a card (not shown). That is, in an inserted position, the card is adapted to stand on-edge in the slot 216 of the connector 210. In the depicted embodiment, the connector 210 includes an optional retention arm 218 for securing and/or strapping a card to the PCB 202 (e.g., a motherboard) and/or to the connector 210.

In the depicted embodiment, the retainer 220 includes a base member 230 coupled to a retaining member 240. The size and shape of base member 230 is responsive to the outer dimensions of the connector 210. That is, the base member 230 substantially resembles a rectangular prism having an inner open area 250 and a predefined form factor. Dimensions of the inner open area 250 are sized to substantially match the corresponding outer dimensions of the connector 210 for a snug fit. The base member 230 includes a first section 232, a second section 234, a third section 236 and a fourth section 238 rigidly coupled in the shape of the rectangular prism. The inner dimensions of the first, second, third and fourth sections 232, 234, 236 and 238 define the inner open area 250. The second and the fourth sections 234 and 238 each include a flat top rail section forming a narrower slot opening at the top compared to the inner open area 250 at the base. The separation between the flat top and substantially parallel rails is sufficient to allow the card to be removably inserted into the slot 216. Additional details of the retainer 220 after being snapped onto the connector 210 are described with reference to FIG. 2B.

In the depicted embodiment, the retaining member 240 includes a proximal section 260 that is slidably (e.g., in a slide able manner) coupled to a distal section 270. The proximal section 260 is fixedly coupled to the base member 230 at a substantially perpendicular angle. More specifically, the proximal section 260 is fixedly coupled to the flat top rail section of the fourth section 238 at a right angle. The distal section 270 is slidable within the proximal section 260. A length 272 of the distal section 270 extending beyond the proximal section 260 is adjustable from a minimum value to a maximum value. The proximal section 260 includes a pair of edge rails 262 to contain the sliding movement of the distal section 270. In a particular embodiment, the distal section 270 may have a corrugated surface to provide improved strength and stiffness. In the depicted embodiment, a distal end of the distal section 270 includes a tab 274 operable for card retention. The tab 274 advantageously provides a uniform distribution of pressure across the card for maintaining the contact integrity when inserted into the connector 210. Additional details of the retaining member 240 are described with reference to FIGS. 3A and 3B.

Referring to FIG. 2B, the retainer 220 is shown after being snapped onto the connector 210. A relative position of a card (not shown) having edge connectors (not shown) removably insertable into the slot, is illustrated by a rectangle 280. The card has a predefined form factor. That is, the height and length of the card are predefined. To facilitate the assembly of the retainer 220 onto the connector 210, the first section 232 of the base member 230 may be slipped under the optional retention arm 218 (if present) of the connector 210 prior to the snap on. The length 272 of the distal section 270 is adjustable to position the tab 274 to be placed over the card. The position of the tab 274 and hence the distal section 270 is locked by a latch mechanism. Additional details of the retaining member 240 and the latch mechanism are described with reference to FIGS. 3A and 3B.

Figure 2C:
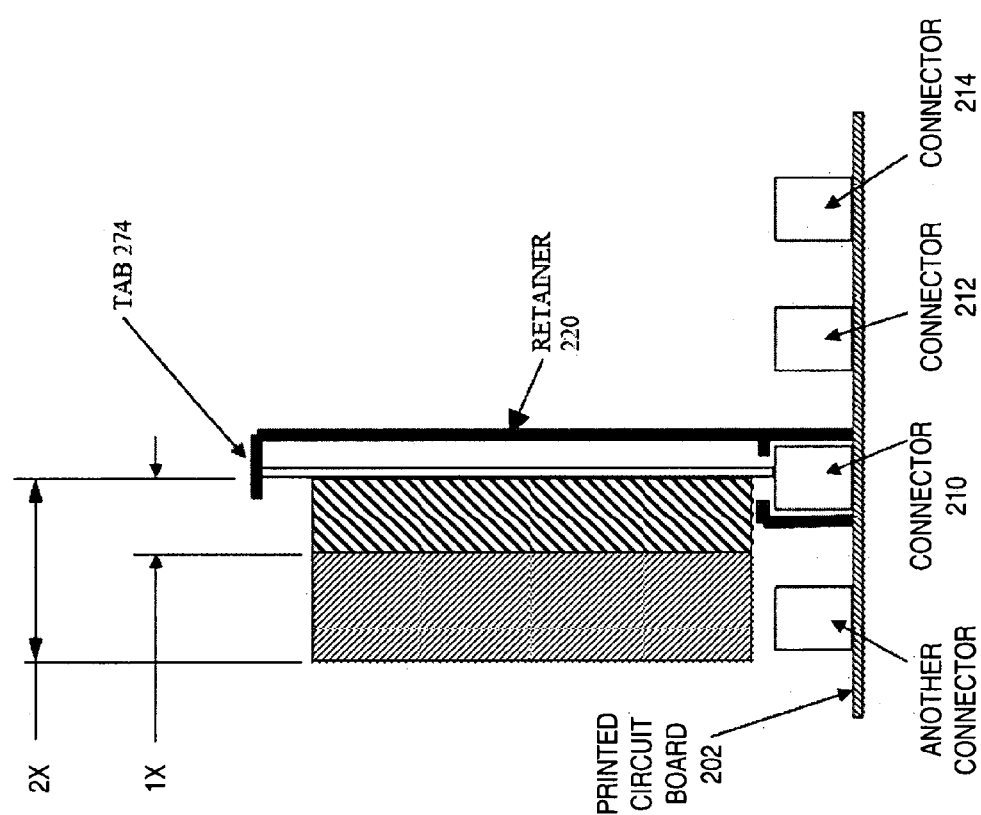
FIG. 2C illustrates a sectional view of a retainer capable of accommodating cards of varying widths, according to an embodiment.

FIG. 2C illustrates a sectional view of a retainer capable of accommodating cards of varying widths, according to an embodiment. In the depicted embodiment, a card 204 may be single wide or double wide. That is, the width of the card 204 may be 1X or 2X. In the double wide configuration, the card 204 may be disposed above another connector. In the depicted embodiment, the retainer 220 is operable to retain the card 204 having single width or double width.

FIGS. 3A and 3B each is a view in perspective illustrating additional features of the retainer 220 including the retaining member 240 described with reference to FIG. 2A's and 2B, according to an embodiment. As described earlier, the length 272 of the distal section 270; is adjustable to accommodate cards of various dimensions and/or form factors. Referring to FIG. 3A, the length 272 of the distal section 270 is adjusted to a full height configuration. In the depicted embodiment, the distal section 270 includes a first ridge 310, a second ridge 312 and a third ridge 320 protruding slightly above the surface. The proximal section 260 includes a corresponding first slot 330, a second slot 332, a third slot 340 and a fourth slot 342. Each one of the first, second, third and fourth slots 330, 332, 340 and 342 are sized or matched to receive one of the first ridge 310, the second ridge 312 or the third ridge 320 and thereby lock the distal section 270 and the proximal section 260 in place for the card retention. To unlock, the first ridge 310, the second ridge 312 and/or the third ridge 320 may be depressed to slide out of the corresponding slot. In a particular embodiment, additional ridges such as ridges 314 and 322 and slots such as slots 334 and 342 may be included in the lock mechanism.

In the depicted embodiment, the length 272 is adjusted to the full height configuration by inserting the first ridge 310 of the distal section 270 into the third slot 340 of the proximal section 260 and the second ridge 312 is inserted into the fourth slot 342. The lock mechanism provided by the combination of the tab 274 and the plurality of ridges and corresponding slots provides the card retention. The relative position of the card (not shown) insertable into the connector (not shown) is illustrated by the rectangle 280.

Referring to FIG. 3B, the length 272 of the distal section 270 is adjusted to a low profile configuration by inserting the first ridge 310 of the distal section 270 into the corresponding first slot 330 of the proximal section 260, the second ridge 312 of the distal section 270 into the corresponding second slot 332 and the third ridge 320 of the distal section 270 into the corresponding third slot 340 of the proximal section 260. The fourth slot 342 is open. The relative position of the card (not shown) insertable into the connector (not shown) is illustrated by the rectangle 280. It is understood that additional card profiles may be accommodated by forming correspondingly placed ridges and slots.

Figure 4:
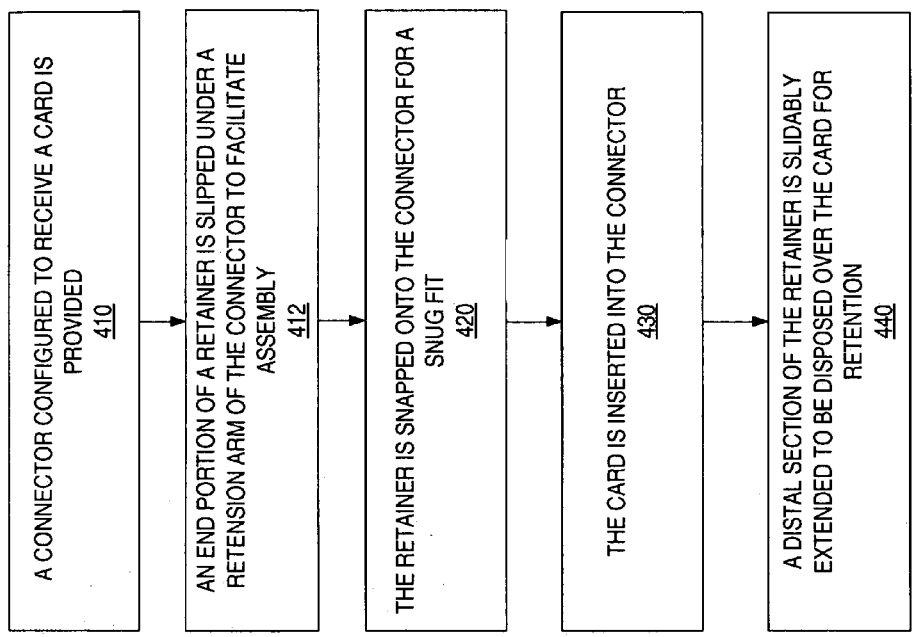
FIG. 4 is a flow chart illustrating a method a method for retaining a card, according to an embodiment.

FIG. 4 is a flow chart illustrating a method for retaining a card, according to an embodiment. In step 410, a connector mounted on a printed circuit board is provided. The connector is configured to receive the card. In a particular embodiment, the connector is the same as the connector 210 and the printed circuit board is the same as the PCB 202 described with reference to FIGS. 2A and 2B. In step 420, a retainer is snapped on to the connector for a snug fit. The retainer includes an inner open area with dimensions substantially matching corresponding outer dimensions of the connector for the snug fit. In a particular embodiment, the retainer is substantially the same as the retainer 220 described with reference to FIGS. 2A and 2B. In step 430, the card is inserted into the connector to electrically couple the card and the connector. In step 440, a distal section, e.g., the distal section 270, of the retainer is slidably extended to be disposed over the card for retention.

Various steps described above may be added, omitted, combined, altered, or performed in different orders. In a particular embodiment, a step 412 may be added to facilitate the tool less, snap on assembly. In step 412, an end portion of the retainer is slipped under a retention arm of the connector prior to the snapping described with reference to step 420.

The illustrative embodiments advantageously provide the retainer 220 that is configured to snap on to the connector 210 in a tool less manner, e.g., without using screws or similar fastening technique. The length 272 the retainer 220 is advantageously adjustable to match the height and form factor of the card. With the added structural support, the retainer 220 may be configured to accommodate a card which may weigh more than a predefined weight such as 400 grams and/or which may occupy two connector slots. Thus, the retainer 220 may be utilized to advantageously accommodate cards of various form factors and weights thereby increasing the flexibility and reducing costs for the assembly and manufacture of the IHS 100 having the connector 210 and the card.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. Accordingly, it is appropriate that the appended claims be construed broadly and in a manner consistent with the scope of the embodiments disclosed herein.

What is claimed is:

1. An apparatus comprising:
   a base member operable to be snapped onto a connector, the base member having an inner open area with dimensions substantially matching corresponding outer dimensions of the connector for a snug fit; and
   a retaining member having a proximal section slidably coupled to a distal section, wherein the proximal section is fixedly coupled to the base member, wherein a length of the distal section extending beyond the proximal section is adjustable to at least one of a low profile configuration and a full height configuration, the length being adjusted to the low profile configuration by inserting a first ridge of the distal section into a corresponding first slot of the proximal section and a second ridge of the distal section into a corresponding second slot of the proximal section.

2. The apparatus of claim 1, wherein the length is adjusted to the full height configuration by inserting the first ridge of the distal section into the third slot of the proximal section.

3. The apparatus of claim 1, wherein the connector is in accordance with a peripheral component interconnect express (PCIe) standard.

4. The apparatus of claim 1, wherein the base member includes:
   a first section, a second section, a third section and a fourth section rigidly coupled to define the inner open area, wherein the first section is operable to slip under a retention arm of the connector, thereby enabling the base member to be removably latched to the connector.

5. The apparatus of claim 4, wherein the second section, the third section and the fourth section is snapped on to a corresponding side of the connector for the snug fit.

6. The apparatus of claim 1, wherein the length is adjustable responsive to a dimension of a card insertable into the connector.

7. The apparatus of claim 6, wherein a weight of the card is greater than 400 grams.

8. The apparatus of claim 6, wherein the card is a graphics card.

9. The apparatus of claim 6, wherein the distal section includes a tab, wherein the length is adjusted to dispose the tab over the card for retention.

10. The apparatus of claim 6, wherein the card is selected to have at least one of a single width and a double width.

11. A method for retaining a card, the method comprising:
    providing a connector;
    snapping on a retainer to snugly fit the connector, wherein the retainer includes an inner open area with dimensions substantially matching corresponding outer dimensions of the connector for the snug fit;
    inserting the card into the connector to electrically couple the card and the connector;
    extending a distal section of the retainer to dispose the distal section over the card for retention; and
    slipping an end portion of the retainer under a retention arm of the connector, thereby enabling the retainer to be removably latched to the connector prior to the snapping.

12. The method of claim 11, wherein the connector is in accordance with a peripheral component interconnect express (PCIe) standard.

13. The method of claim 12, wherein the connector is in conformance with a selectable form factor of the PCIe standard.

14. The method of claim 13, wherein the form factor is at least one of X1, X4, X8 and X16 form factors.

15. An information handling system (IHS) comprising:
    a processor;
    a card operable to perform at least one predefined function;
    a connector to electrically couple the processor and the card; and
    a retainer configured to retain the card when the card is removably coupled to the connector, wherein the retainer includes:
    a base member operable to be snapped onto the connector, the base member having an inner open area with dimensions substantially matching corresponding outside dimensions of the connector for a snug fit; and
    a retaining member having a proximal section slidably coupled to a distal section, wherein the proximal section is fixedly coupled to the base member, wherein a length of the distal section extending beyond the proximal section is adjustable to at least one of a low profile configuration and a full height configuration, the length being adjusted to the low profile configuration by inserting a first ridge of the distal section into a corresponding first slot of the proximal section and a second ridge of the distal section into a corresponding second slot of the proximal section.

16. The system of claim 15, wherein a weight of the card is greater than 400 grams.

17. The system of claim 15, wherein the connector is in accordance with a peripheral component interconnect express (PCIe) standard.

* * * * *